United States Patent [19]

Mori et al.

[11] 4,285,027
[45] Aug. 18, 1981

[54] COOLING SYSTEM

[75] Inventors: Shigeru Mori, Sakai; Katsumi Sakitani, Kawachinagano, both of Japan

[73] Assignees: Daikin Kogyo Co., Ltd., Osaka; Nippon Electric Company Limited, Tokyo, both of Japan

[21] Appl. No.: 3,085

[22] Filed: Jan. 12, 1979

[51] Int. Cl.³ .................... H02B 1/00; F28D 21/00
[52] U.S. Cl. ........................... 361/385; 174/15 HP; 336/58; 165/104.14; 165/104.17; 165/104.21
[58] Field of Search .................. 174/15 HP; 336/58; 361/381, 385, 389; 165/105, 104 S

[56] References Cited

U.S. PATENT DOCUMENTS

| | | | |
|---|---|---|---|
| 2,825,034 | 2/1958 | Birchard | 165/104 S X |
| 3,112,877 | 12/1963 | Snelling | 165/104 S X |
| 3,651,865 | 3/1972 | Feldmanis | 165/104 S X |
| 4,046,193 | 9/1977 | Dougherty | 361/385 X |

Primary Examiner—Albert W. Davis
Attorney, Agent, or Firm—Cushman, Darby & Cushman

[57] ABSTRACT

The invention is concerned with a cooling system for cooling telecommunication equipment at an unattended microwave relay station or the like located in desert or like regions where there is a large difference between the maximum daytime temperature and minimum nighttime temperature. The cooling system includes an outdoor heat exchanger disposed outside and above a shelter accommodating the telecommunication equipment, an indoor heat exchanger disposed in the shelter and a heat storage means disposed at an intermediate level between these heat exchangers. These heat exchangers and the heat storage means are connected with one another by conduit means charged with a condenseable refrigerant, such that the refrigerant is naturally circulated in said conduit means by gravity. When the outdoor temperature is low at night, most part of the cooling energy absorbed by the outdoor heat exchanger is stored in the heat storage means, while the remaining part is used for cooling the telecommunication equipment, whereas during the daytime when the outdoor temperature is high, the cooling energy is released from the heat storage means to effectively cool the telecommunication equipment. The cooling of telecommunication equipment can thus be performed without requiring any external electric power and frequent maintenance work.

9 Claims, 14 Drawing Figures

COOLING SYSTEM

BACKGROUND OF THE INVENTION

The present invention relates to a cooling system for cooling a space in a room and, more particularly to a cooling system for cooling telecommunication equipment at a radio relay station located in desert or like regions where there is a large difference between the daytime and nightime temperatures.

Still more particularly, the invention is concerned with a non-powered cooling system having refrigerant circulated naturally by gravity without making use of any external power. Low temperature energy or cooling energy is stored in a heat accumulator or storage at night when outdoor temperature is low, for release from the heat storage to effectively cool the telecommunication equipment during daytime when the temperature is high.

There have been a remarkable growth of microwave communication systems for covering wide areas in various regions of the world. In a long-distance microwave communication system, it is necessary to construct unattended relay stations at intervals of 10 to 50 Km.

Figure 1A:
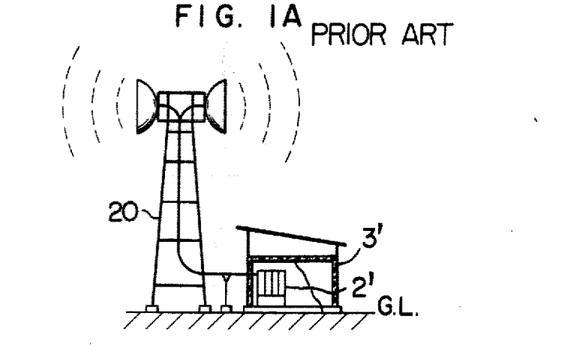
FIGS. 1A and 1B show the layout of a conventional radio relay station.
Figure 1B:
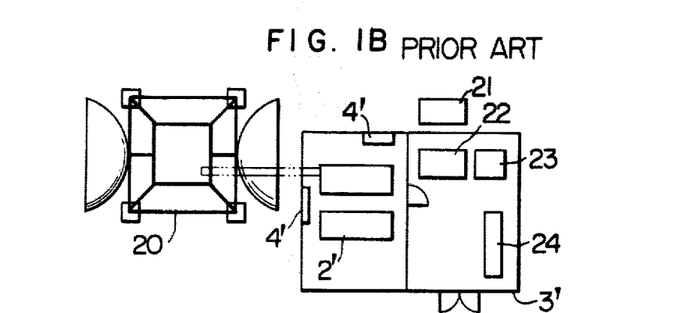

FIGS. 1A and 1B schematically show the construction of a typical conventional radio relay station, which has a steel tower 20 for supporting a parabolic antenna, and a shelter for accommodating various telecommunication equipment 2'. In this conventional relay station, the maximum power consumed by these quipment is as large as about 1 Kw. To cope with this demand for electric power, in the conventional relay station, it has been necessary to generate a large electric power by means of a generator 22 driven by a diesel engine or the like. Generated electric power is supplied, through a rectifier 23 and batteries 24, to the telecommunication equipment 2', and also to a motor-driven compressor of a cooling system 4', for cooling the telecommunication equipment 2'. Thus, the conventional relay station required a frequent supply of fuel and maintenance work.

However, as a result of recent development of semiconductor devices, the power consumption on the part of the telecommunication equipment has been reduced to 50 to 150 W (43 to 129 Kcal/hr) which is only 1/20 to 1/6 of that consumed by the conventional one. Consequently, a power supply means of much smaller capacity suited for unattended relay stations, such as battery or solar battery, has become sufficient for the telecommunication equipment. Under the circumstances, the power consumption on the part of the motor-driven compressor of the cooling system, which amounts to 0.75 Kw or so, is impractically large.

For this reason, there is an increasing demand for the non-powered cooling system which requires no maintenance work.

SUMMARY OF THE INVENTION

It is therefore an object of the present invention to provide a cooling system having a cooling apparatus adapted to allow a refrigerant to be circulated by gravity without resorting to any other external supply of electric power, a heat storage adapted to store cooling energy at night for release in daytime to effect the cooling. According to the invention, there is provided an unattended non-powered cooling system requiring less maintenance work. Although the present cooling system is not of so large a capacity as the conventional motor-driven cooling system, it is sufficiently capable of cooling the transistorized telecommunication equipment as mentioned above.

This cooling system is particularly suited for a radio relay station located in desert or like regions in Africa or Middle East where a large difference, e.g., 35° C. to 50° C., is observed between daytime and nighttime temperatures.

More specifically, according to the invention, there is provided a cooling system for use in an unattended radio relay station having telecommunication equipment and a shelter therefor, including a non-powered cooling apparatus and a heat storage, wherein the cooling energy collected at night under the low temperature state is stored in the heat storage, and is released from the heat storage for cooling the inside of the shelter, thereby to maintain the telecommunication equipment at an adequately low temperature level.

The above and other objects, as well as advantageous features of the invention will become more clear from the following description of the preferred embodiments taken in conjunction with the accompanying drawings.

BRIEF DESCRIPTION OF THE DRAWINGS

FIGS. 2 to 8 show the cooling system for a radio relay station constructed in accordance with the invention in which:

DESCRIPTION OF THE PREFERRED EMBODIMENTS

Figure 2:
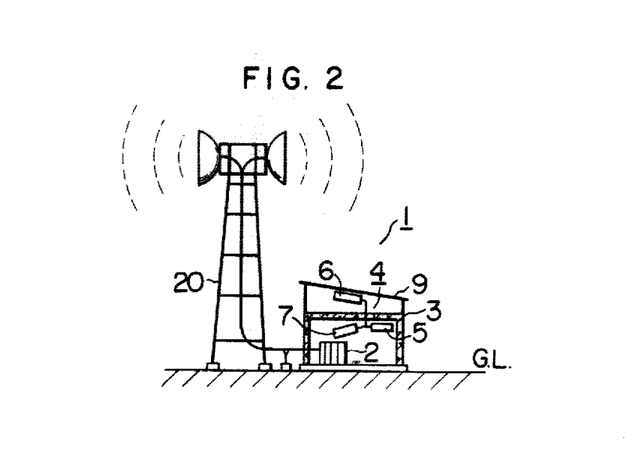
FIG. 2 shows partly in section a side elevation of a radio relay station.

A basic arrangement of a cooling system in accordance with the invention will now be described with specific reference to FIG. 2 and FIGS. 3A, 3B.

Referring to these Figures, a radio relay station 1 has a steel tower 20 for supporting a parabolic antenna and a shelter 3 for accommodating telecommunication equipment for amplifying the microwave signal. As shown in FIG. 3A, the walls of the shelter 3 has a layer of heat insulating material 8 such as urethane foam or the like sandwiched between steel plates with laminated white vinyl chloride coating. The top of the shelter is covered by a sun shade 9. Thus, the shelter 3 has a heat insulating construction and is adapted to be installed on the ground.

Figure 3A:
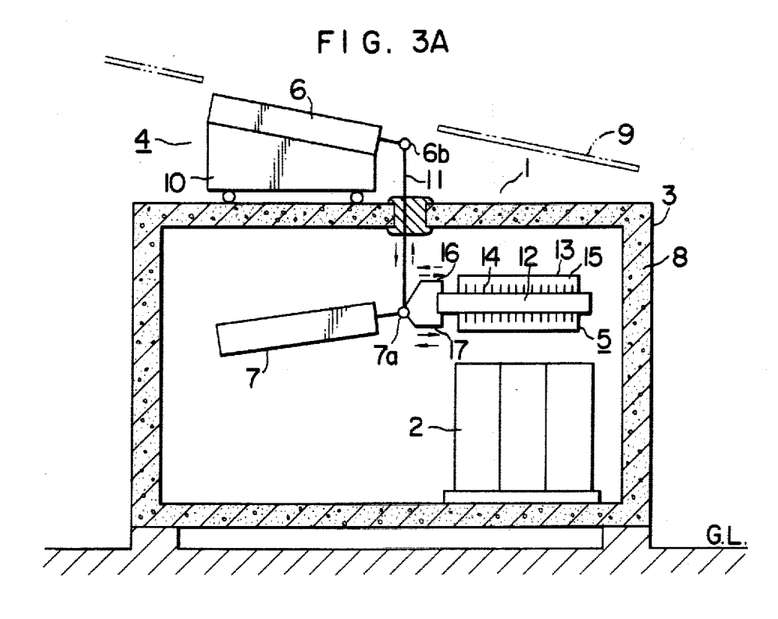
FIGS. 3A and 3B are front elevational view and a side elevational view, respectively, of a cooling apparatus and a heat storage disposed in the shelter of the radio relay station as shown in FIG. 2.
Figure 3B:
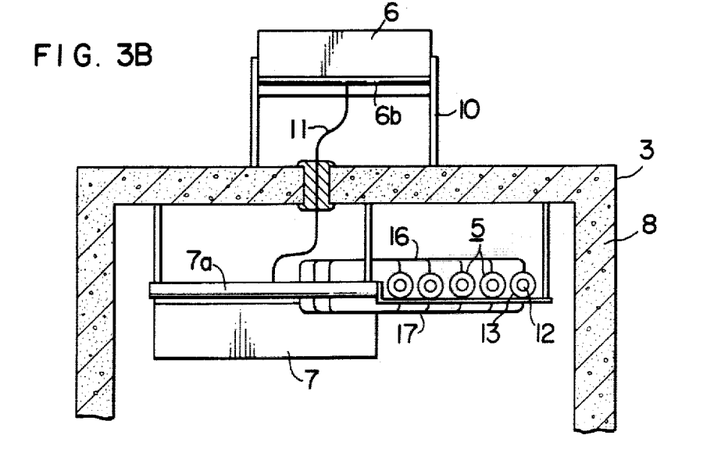

A cooling apparatus 4 used in the relay station 1 has, as shown in FIG. 3A, an outdoor heat exchanger 6 mounted on a column 10 disposed on the top of the shelter 3, and an indoor heat exchanger 7 installed at a level lower than the outdoor heat exchanger 6. These heat exchangers 6 and 7 adapted to function as a condenser and an evaporator, respectively, are connected to each other through a piping to form a closed circuit charged with a condensable gaseous refrigerant. The refrigerant is naturally circulated in this closed circuit by gravity.

As will be clearly seen from FIG. 3A, the outdoor heat exchanger 6 is slanted so that a lower header 6b provided at the liquid refrigerant outlet of the heat exchanger 6 is placed below the level of this heat exchanger 6, while the indoor heat exchanger 7 is also slanted so that an upper header 7a provided at the gaseous refrigerant outlet of the heat exchanger 7 is placed above the level of this heat exchanger 7. The exchangers 6 and 7 are communicated with each other through a single refrigerant pipe 11 interconnecting the lower header 6b of the exchanger 6 and the upper header 7a of the exchanger 7.

On the other hand, a heat storage 5 is placed at a level lower than the outdoor heat exchanger 6 and higher than the indoor heat exchanger 7, i.e., at an intermediate level between the heat exchangers 6 and 7. As shown in FIGS. 3A and 3B, the heat storage 5 has a plurality of double tube structures arrayed side by side in a horizontal plane, each of the double tube structures having an inner tube 12 and an outer tube 13. A plurality of fins 14 are attached at a regular interval to the outer peripheral surface of each inner tube 12. The annular space in each double tube structure between the inner and outer tubes 12 and 13 is charged with a heat storing agent.

Gas tubes 16 and liquid tubes 17 are connected to the upper and lower sides of the inner tubes 12. These gas and liquid tubes 16 and 17 are connected to the upper and lower sides of the upper header 7a, i.e., to the gas side and liquid side of the upper header 7a, thereby to form a closed shunt circuit. Thus, the closed shunt circuit is connected to the aforementioned closed circuit. The arrangement is such that a closed natural circulation circuit of gravity flow type is formed between the heat storage 5 and the outdoor heat exchanger 6 or between the heat storage 5 and the indoor heat exchanger 7, so that the heat storage 5 may serve as an evaporator or a condenser, depending on the outdoor temperature.

The aforementioned circuits are charged with a condensable gaseous refrigerant which makes a phase change from liquid to gas and vice versa in response to a predetermined temperature change.

Figure 10:
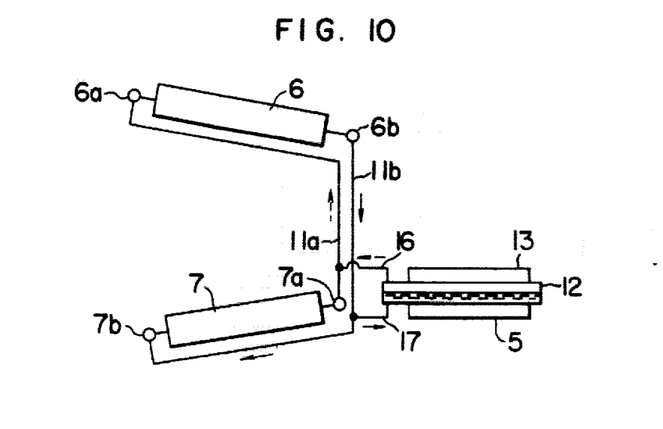
FIG. 10 shows a further embodiment of the invention.

Since the heat storage 5 serves as an evaporator and also as a condenser, the amount of refrigerant in the closed circuit is so selected that the inner tubes 12 are filled to an intermediate level thereof with the refrigerant under a predetermined pressure, as shown in FIG. 10. Thus, heat exchange is effected in each double tube structure between the refrigerant flowing in the inner tube 12 and the heat storing agent 15 charged in the space between the inner and outer tubes 12 and 13, in response to the evaporation and condensation of the refrigerant in the inner tube 12. More specifically, when the refrigerant flowing through the inner tube 12 is evaporated, the heat storing agent 15 is cooled, while, when the refrigerant is condensed, the heat storing agent 15 is heated.

The aforementioned condensable gaseous refrigerant preferably has a large latent heat and a high saturation pressure. For instance, flouric refrigerants such as R-22 ($CHF_2Cl$, chlorodifluoromethane), R-12 ($CCl_2F_2$, dichlorodifluoromethane), R-11 ($CCl_3F$, trichlorofluoromethane) or the like can conveniently be used as the refrigerant for this cooling system. The refrigerant R-22 having a high saturation pressure in the high temperature range is most suited for the present cooling system from the view point of the cooling efficiency.

On the other hand, the material used as the heat storing agent 15 is required to have a large specific heat and a melting point comparable to the possible higher temperature of the inside of the shelter 3. At the same time, the temperature at which the material makes the phase change from liquid to solid and vice versa has to be substantially constant. Further, the material should exhibit a small supercooling and should be less corrosive, less poisonous and less expensive.

Various materials can be used as the heat storing agent 15, the typical examples of which are: fatty acids having a melting point near the room temperature in the shelter, e.g., caprylic acid ($C_7H_{15}COOH$, melting point 16° C.), capric acid ($C_9H_{19}COOH$, 31.5° C.), undecylic acid ($C_{10}H_{21}COOH$, 28.6° C.), lauric acid ($C_{11}H_{23}COOH$, melting point 44° C.), myristic acid ($C_{13}H_{27}COOH$, 58° C.) and palmitic acid ($C_{15}H_{31}$, 63°–64° C.); solid paraffins having a melting point of between 37.8° C. to 64.6° C.; dichlorobenzene (P-$C_6H_4Cl_2$, 52°–54° C.) or the like. These materials are selectively used depending on the room temperature in the shelter 3.

The annular space between the inner tube 12 and the outer tube 13 is filled up to 95% of its full volume with the heat storing agent 15 in the liquid state, while the remaining part of volume is filled with $N_2$ gas until the internal pressure is increased up to 4 Kg/cm². Due to this increased internal pressure, the annular space between the inner and outer tubes 12 and 13 can be maintained at a pressure higher than the atmospheric pressure, even when the cooled heat storing agent 15 is solidified to reduce its volume, so that the invasion of external air is fairly avoided even if the outer tube 13 is not strictly airtight.

The outdoor and indoor heat exchangers 6 and 7 are preferably of the cross-fin type which is suitable for the heat exchange with ambient air, so that the heat exchange may effectively be made between the refrigerant and the ambient air, by making positive use of the natural convection of air. However, if there is any surplus electric power available, a motor-driven fan may be used for effecting a forced drafting, thereby to enhance the heat exchange.

The cooling system of the invention having the described construction functions in a manner explained hereinunder.

At night when the outdoor temperature is low, most part of the cooling energy collected at the outdoor heat exchanger 6 is introduced into the heat storage 5 through the natural circulation between the exchanger 6 and the heat storage 5, while the remaining part of the cooling energy is transferred to the indoor heat exchanger 7 through the natural circulation between the outdoor and indoor heat exchangers 6 and 7, thereby to cool the air in the shelter 3.

On the other hand, during the daytime when the outdoor temperature is considerably high, the outdoor heat exchanger 6 cannot function as a condenser. Under this state, the cooling energy stored in the heat storing agent 15 of the heat storage 5 is utilized for cooling, with the heat storage 5 used as the condenser. Thus, the refrigerant is circulated naturally by gravity between the heat storage 5 and the indoor heat exchanger 7, thereby to effectively cool the inside of the shelter 3.

More specifically, during the night when the outdoor temperature is below 40° C., the refrigerant in the outdoor heat exchanger 6 releases latent heat and gets condensed and liquefied. The liquefied refrigerant is collected in the lower header 6b and flows down along the inner surface of the piping 11, as shown by a solid-line arrow in FIG. 3A. Most part of this liquid refrigerant flows into the inner tubes 12 of the heat storage 5 through the liquid pipe 17, while the remaining part is made to flow into the indoor heat exchanger 7 through the upper header 7a. In the indoor heat exchanger 7, the liquid refrigerant absorbs heat from the air inside the shelter while being evaporated.

Meanwhile, in the heat storage 5, the heat storing agent 15 is cooled and solidified by the latent heat absorbed by the refrigerant, while the latter is evaporated.

The refrigerant evaporated in the indoor heat exchanger 7 and the heat storage 5, now in the gaseous phase, is collected at the upper header 7a of the indoor heat exchanger 7, and flows into the outdoor heat exchanger 6 through the central portion of the piping 11.

The descending flow of the liquid refrigerant and the ascending flow of the gaseous refrigerant simultaneously take place in the common piping 11. These flows, however, do not disturb or hinder each other, when the heat generation from equipment 2 is not so large, because the ascending flow of the gaseous refrigerant has a sufficiently small flow velocity, due to a small rate of evaporation of the refrigerant, so that the liquid flows down in contact with the wall of the piping 11, while the gas flows upward through the central portion of the same piping 11.

As a result of the natural circulation of refrigerant involving the phase change of the refrigerant from gas to liquid and vice versa, the cooling energy is stored in the heat storing agent 15, and, at the same time, the air inside the shelter 3 is effectively be cooled.

During the daytime when the outdoor temperature is raised to a level above 50° C., for example, the refrigerant which has cooled the air inside the shelter 3 and evaporated in the indoor heat exchanger 7 cannot be condensed by the outdoor heat exchanger 6. Therefore, the evaporated refrigerant does not flows upward through the piping 11 but is introduced into the inner tubes 12 of the heat storage 5, via the upper header 7 and the gas pipe 16. Then, the gaseous refrigerant undergoes a heat exchange with the heat storing agent 15, in which the cooling energy has been stored, so as to be liquefied and condensed. The condensed refrigerant then flows back to the indoor heat exchanger 7, through the liquid pipe 17. As this circulation is continued, the cooling energy stored in the heat storage 5 in taken out and conveyed by the refrigerant to effectively cool the air in the shelter 3, thereby to maintain the temperature of the telecommunication equipment 2 at a desired temperature, e.g., about 50° C. or lower.

The fins 14 attached to the outer surface of the inner tube 12 enhances and promotes the heat exchange between the refrigerant and the heat storing agent 15. At the same time, the heat exchange between the air and refrigerant is performed at each of the heat exchangers 6 and 7 through the natural convection of air, even in the absence of a motor-driven fan.

Further, since the heat storage 5 is disposed at an intermediate level between the outdoor and indoor heat exchangers 6 and 7, liquid refrigerant condensed in the outdoor heat exchanger 6 by the low outdoor temperature at night is allowed to smoothly flow into the heat storage 5 and the indoor heat exchanger 7 soledly by gravity, while the gaseous refrigerant evaporated in the indoor heat exchanger 7 and the heat storage 5 can smoothly flows upward into the outdoor heat exchanger 6. Thus, the natural circulation of the refrigerant involving the phase change is maintained.

Similarly, during the daytime when the outdoor temperature is high, the natural circulation of the refrigerant is maintained by gravity, because the heat storage 5 now acting as a condenser is disposed at a level higher than the indoor heat exchanger 7 acting as an evaporator.

The heat storage 5 has to play a double role, i.e., a role of an evaporator for nighttime and a role of condenser for daytime. To cope with this demand, the heat storage 5 is disposed horizontally, and is filled with the liquid refrigerant to an intermediate level of the inner tubes 12. When the heat storage 5 functions as an evaporator at night, the refrigerant condensed in the outdoor heat exchanger 6 is evaporated through a heat absorption from the heat storing agent 15, thereby cooling the latter by the latent heat, while the refrigerant itself is evaporated to become gaseous refrigerant. Since a gas plenum or gaseous space is preserved at the upper portion of each inner tube 12, the evaporated refrigerant can flow back to the outdoor heat exchanger 6, via the gaseous space in each inner tube 12 and the gas pipe connected to one end of the inner pipe 12 to open in the upper gaseous space.

When the heat storage functions as a condenser during the daytime, the refrigerant which has been evaporated as a result of the heat exchange in the indoor heat exchanger 7 to cool the indoor air is introduced into the upper gaseous space of each inner tube 12, so as to be cooled and condensed by the heat storing agent 15 in which the cooling energy has been stored during the night. This condensation is performed in an efficient manner, because about a half of the whole surface area of the inner tube 12, above the level of the liquid refrigerant, serves as the heat transfer surface. It will be seen that the two-way heat exchange is made in an efficient manner, through the gaseous space of the inner tubes 12, during both daytime and nighttime.

When the heat storage 5 is not disposed in horizontal posture, the liquid refrigerant and the gaseous refrigerant are collected, respectively, at the upper and lower portions of the heat storage 5. In such a case, the liquid refrigerant at the lower portion is evaporated to cool the heat storing agent 15 at night, whereas during daytime, the gaseous refrigerant at the upper portion is condensed by the cooling energy derived from the heat storing agent 15.

Needless to say, it is possible to enhance the evaporation and condensation of the refrigerant in the heat storage by forming on the inner surface of the inner tube 12 a wick which makes a capillary action.

In the cooling system of the invention, the heat storage 5 has a double tube construction constituted by an inner tube charged with the refrigerant and an outer tube 13 which cooperates with the inner tube in defining therebetween an annular space charged with the heat storing agent. Since the refrigerant is confined at a high pressure within the inner tube 12 having a small diameter, the heat storage 5 as a whole sufficiently withstands the high internal pressure of the refrigerant. Further, in the described embodiment, almost all of the volume in the annular space between the inner and the outer tubes is occupied with the refrigerant, while the remaining part of the volume is filled with a compressed gas. Therefore, the pressure in the heat storage 5 does not come down to a value below the atmospheric pressure, even when the volume of the heat storing agent 15 is reduced as a result of cooling and solidification of the same. Therefore even if the airtightness of the outer tube 13 is not so perfect, the ambient air is prevented from coming into the heat storage 5, contributing to the maintenance of the quality of the heat storing agent 15.

The use of fatty acids as the heat storing agent 15 offers the following advantages. Namely, this heat storing agent has a high solidifying point, and the required superheating is as small as several degrees when the solidifying point at the commencement of solidification is different from the melting point to require some supercooling. Therefore, the refrigerant need not be at a low temperature to solidify the heat storing agent. A rather high nighttime outdoor temperature around 30° C. is adequate for the achievement of the solidification.

In addition, the fatty acids have a relatively stable performance, and are generally less poisonous. Particularly, the fatty acids having a large number of carbon exhibits superior properties such as small poisoning power.

Figure 4:
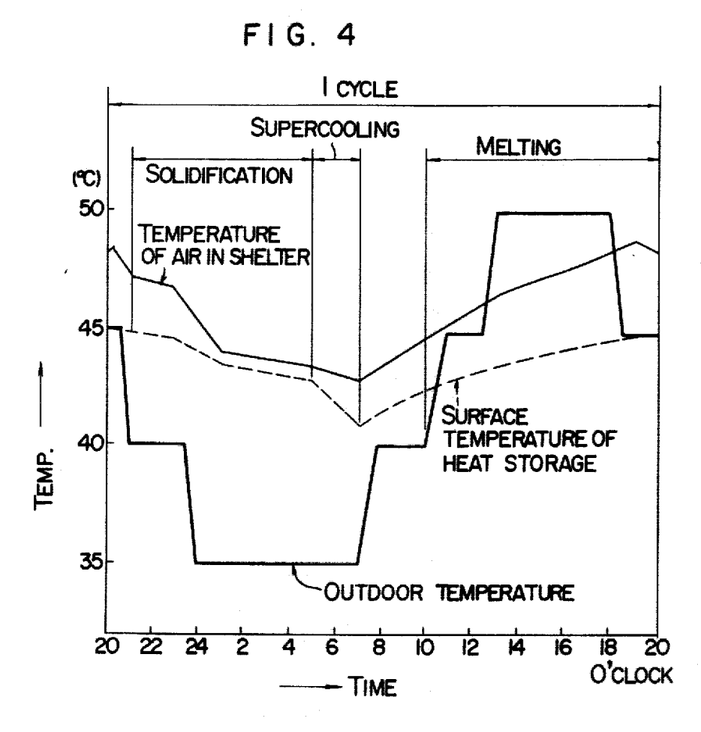
FIG. 4 shows temperature variation in various structural elements shown in FIGS. 3A and 3B.

Hereinunder, experimental results obtained with a cooling system of this invention will be described with specific reference to FIG. 4.

In this experiment, the size of the shelter 3, the size and construction of the heat insulating structure and the heat output from the equipments in the shelter 3 were selected to be equal to those of the actual radio relay station, so as to simulate the actual operating condition as much as possible. The shelter was situated in a room whose temperature was changed to simulate the large temperature change experienced in the desert or like regions in Africa or Middle East. The state of cooling in the shelter 3, and the operation of the heat storage 5 were observed employing a cooling system as shown in FIGS. 3A and 3B, the result of which is shown in FIG. 4.

More specifically, a rectangular parallelopiped shelter of 2.3 m in width, 2.3 m in depth and 3.1 m in height was used. In order to reduce the overall heat transmission coefficient, a heat insulating material lining 8 of urethane foam of 150 mm in thickness was used. The urethane foam lining 8 was sandwitched by a pair of 1.6 mm thick steel sheets which in turn were coated with laminated white vinyl chloride coating. Consequently, the overall heat transmission coefficient was reduced to $K=0.2$ Kcal/m$^2$ h°C., while the reflection factor of the wall surface was increased to $\epsilon=0.6$ or higher. Incandescent lamps or the like for producing total heat output of 150 W were placed at a position where the telecommunication equipment 2 is to be placed, so as to simulate the latter.

As means for changing the temperature of the inside of the shelter 3, an electric heater of 0.5 kW and a motor-driven fan were placed above the shelter. The temperature in the shelter 3 was changed between 50° C. and 35° C. by suitably operating these heater and fan, to simulate the ambient temperature change. The simulated temperature of 45° C. is for 19 to 20 o'clock; 40° C., for 21 to 23 o'clock; 35° C., for 24 to 7 o'clock; 40° C., for 8 to 10 o'clock; 45° C., for 11 to 12 o'clock; and 50° C., for 13 to 18 o'clock, as shown in FIG. 4.

Cross-fin type heat exchangers were used as the outdoor heat exchanger 6 and the indoor heat exchanger 7 of the cooling apparatus, while refrigerant R-22 was used as the refrigerant. Also, five units of heat storage 5 were arranged side by side, in which a fatty acid was used as the heat storing agent 15.

As will be seen from FIG. 4, it was confirmed from the experimental results that the inside temperature of the shelter 3 can be maintained below 50° C. even when the outdoor temperature is kept at its maximum.

The heat storing agent 15 in the heat storage 5 was solidified during nighttime, i.e., from 21 o'clock to 5 o'clock, when the outdoor temperature was between 40° C. and 35° C., and was supercooled in the early morning hours till 7 o'clock when the outdoor temperature is 35° C. Then, as the outdoor temperature was elevated, the heat storing agent 15 began to melt at about 10 o'clock (outdoor temp. 45° C.). The melting was continued throughout the daytime when the outdoor temperature is maintained at its maximum, i.e., 50° C., the daytime lasting until 20 o'clock when the outdoor temperature was lowered to 45° C.

The cooling system of this embodiment is suitable for use with a microwave relay station having a telecommunication equipment of comparatively small heat output of about 150 W. If the heat output is larger, the amount of refrigerant evaporated in the indoor heat exchanger 7 and in the heat storage 5 must be much larger.

In such a case, it will become necessary to smooth the gravity-induced natural circulation of the refrigerant through various measures. For instance, as will be detailed in the description of other embodiments, two separate pipes interconnecting the lower header 6b of the outdoor heat exchanger 6 and the upper header 7a of the indoor heat exchanger may be employed. In this case, one of these pipes is used for the gaseous refrigerant coming up from the indoor heat exchanger 7, while the other pipe is used for the liquid refrigerant coming down from the outdoor heat exchanger 6.

Alternatively, the outdoor heat exchanger 6 and the indoor heat exchanger 7 may be additionally provided with an upper header and a lower header, respectively. In this case, a smooth flow of the refrigerant can be obtained by connecting a gas pipe and a liquid pipe, respectively, between the upper header of the outdoor heat exchanger 6 and the upper header 7a of the indoor heat exchanger 7, and between the lower header 6b of the outdoor heat exchanger 6 and the lower header of the indoor heat exchanger 7.

In the described embodiment, the heat storage 5 is disposed at an intermediate level between the outdoor and indoor heat exchangers 6 and 7, and connected to these heat exchangers through refrigerant pipes, so that the refrigerant may flow naturally by gravity, thereby to store cooling energy in the heat storage 5. This arrangement, however, permits further modifications. For instance, instead of connecting the heat storage 5 to the cooling apparatus 4 through refrigerant pipes, the arrangement may be such that the heat storing agent 15 of the heat storage 5 is air-cooled within the shelter 3, which in turn is cooled by the indoor heat exchanger 7 of the cooling apparatus 4.

Figure 5:
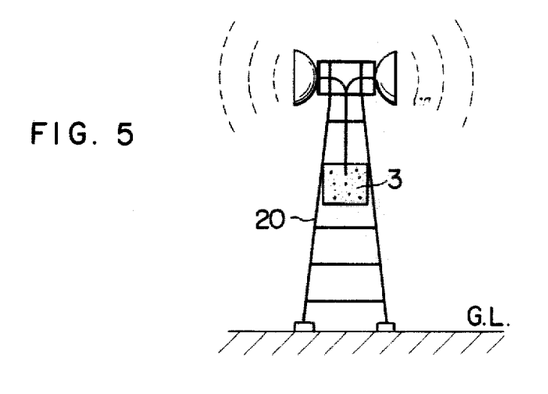
FIG. 5 shows another embodiment of the invention in which the shelter of the station is installed above the ground surface.
Figure 6:
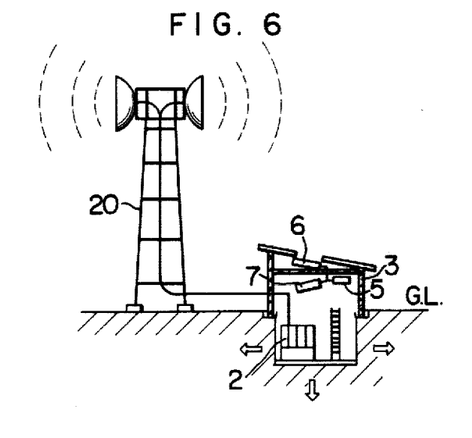
FIG. 6 shows still another embodiment of the invention in which the shelter is half burried in the ground.
Figure 7:
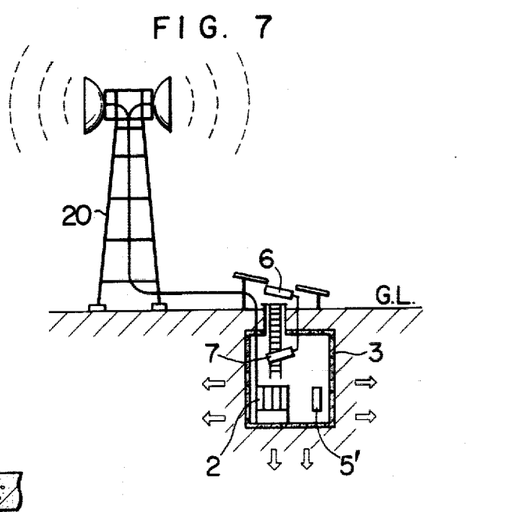
FIG. 7 shows a further embodiment of the invention in which the shelter is entirely burried under the ground.

Further, it is possible to install the shelter 3 on the steel tower 20 at a certain level from the ground surface, as shown in FIG. 5. It is also possible to partly or entirely burry the shelter 3 under the ground, as shown in FIG. 6 or 7. In such a case, the portion of the walls of the shelter 3 lying under the ground surface is constituted by a material having a good heat conductivity such as iron or stainless steel, so that the soil around the shelter may be utilized as the heat storage. Needless to say, it is possible to use a heat storage 5' installed in the shelter 3, simultaneously with a heat storage constituted by the soil, as shown in FIG. 7. In the latter case, it is possible to reduce the capacity of the indoor heat storage 5'.

Figure 8:
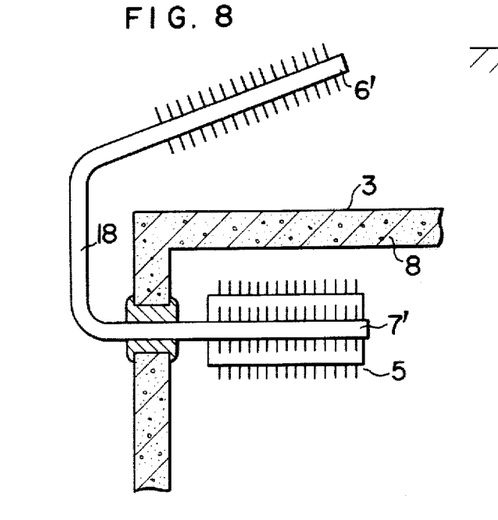
FIG. 8 shows a further embodiment of the invention.

FIG. 8 shows still another embodiment of the invention in which a heat pipe 18 provided at its both ends with fins and having no wick is used as the cooling apparatus 4. In this case, the upper portion of the heat pipe 18 located above the shelter 3 constitutes the outdoor heat exchanger 6', while the lower portion located in the shelter 3 constitutes the indoor heat exchanger 7'. At the same time, the heat storage 5 is installed to surround the indoor heat exchanger 7' in close contact with the latter. The heat pipe 18 is charged with the refrigerant. In this embodiment, as in the foregoing embodiments, the refrigerant in the outdoor heat exchanger 6' is cooled and solidified due to the lower temperature at night, and comes down into the indoor heat exchanger 7° to cool the heat storage 5. In the daytime when the outdoor temperature is high, the cooling energy is released from the heat storage 5, so as to effectively cool the air in the shelter 3 and, accordingly, the telecommunication equipment 2 disposed in the shelter 3.

Figure 9A:
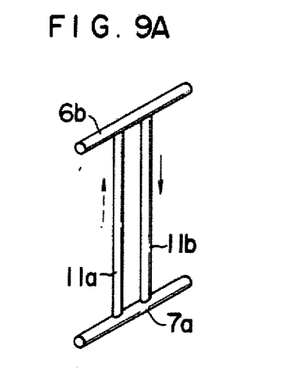
FIGS. 9A, 9B and 9C show various piping suited for the embodiments of the invention.
Figure 9B:
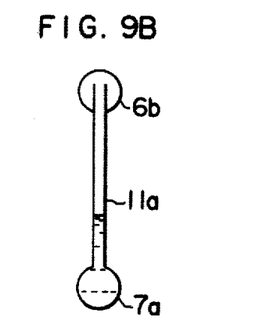
Figure 9C:
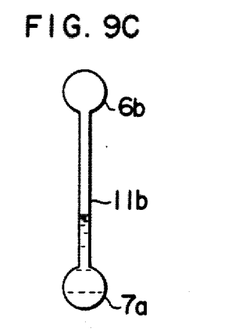

FIGS. 9A to 9C show a modification of the embodiment shown in FIG. 3. In this embodiment, a gas pipe 11a and a liquid pipe 11b are used as shown in FIG. 9A for connecting the lower header 6b of the outdoor heat exchanger 6 and the upper header 7a of the indoor heat exchanger 7. More particularly, the gas pipe 11a connects the upper header 7a to the gaseous upper space of the lower header 6b, as shown in FIG. 9B, while the liquid pipe 11b connects the lower portion of the lower header 6b to other portion of the upper header 7a than the portion to which the gas pipe 11a is connected, as shown in FIG. 9C.

This arrangement affords an enhanced natural circulation of the refrigerant by gravity, so that the cooling system can effectively cool the electric appliances having a larger heat output than those of FIG. 3. Namely, the liquid refrigerant condensed in the outdoor heat exchanger 6 flows down along the liquid pipe 11b connected to the lower side of the lower header 6b, while the gaseous refrigerant evaporated in the indoor heat exchanger 7 and in the heat storage 5 can flow upward through the gas pipe 11b which opens in the upper gaseous space in the lower header 6b, so that the ascending flow of the gaseous refrigerant and the descending flow of the liquid refrigerant do not hinder each other, thereby to smooth the natural circulation of the refrigerant.

The cooling systems as shown in FIGS. 3 and 9A to 9C are suitable for use for cooling a communication equipment of comparatively small heat output. When a larger heat is generated by the communication equipment, the evaporation of the refrigerant in the indoor heat exchanger 7 and the heat storage 5 may be enhanced correspondingly.

Consequently, the flow velocity of the gaseous refrigerant is increased. In such a case, the ascending flow of gaseous refrigerant and the descending flow of the liquid refrigerant will hinder each other, when the outdoor heat exchanger 6 and the indoor heat exchanger 7 are provided with single headers, respectively, resulting in a less efficient natural circulation of the refrigerant.

To avoid this, each of the outdoor and indoor heat exchangers 6 and 7 can have two headers, as shown in FIG. 10. More specifically, a gas pipe 11a is connected between the upper header 7a of the indoor heat exchanger 7 and an upper header 6a which is provided at the upper gas inlet side of the inclined outdoor heat exchanger 6, while a liquid pipe 11b is used to connect the lower header 6b of the outdoor heat exchanger 6 and a lower header 7b provided at the lower liquid inlet side of the inclined indoor heat exchanger 7, so that a closed circulation circuit is formed by the outdoor heat exchanger 6, liquid pipe 11b, indoor heat exchanger 7 and the gas pipe 11a. Further, gas pipes 16 and liquid pipes 17 shunting from these gas pipe 11a and liquid pipe 11b connect these pipes to the heat storage 5. Other structural elements are all identical to those of the embodiments as shown in FIGS. 3 and 9A to 9C.

In operation, the gaseous refrigerant coming from the indoor heat exchanger 7 acting as an evaporator and the gaseous refrigerant coming from the heat storage 5 flow upwardly into the upper header 6a of the outdoor heat exchanger 6, through the upper header 7a and the gas pipes 16 leading from the upper side of the inner tube 12, respectively, and then flows into the outdoor heat exchanger 6. The gaseous refrigerant in the outdoor heat exchanger 6 is cooled and condensed as a result of a heat exchange with the low temperature ambient air, and the liquefied refrigerant flows down through the lower header 6b and the liquid pipe 11b, due to gravity. A part of liquid refrigerant then flows back to the heat storage 5 through the liquid piep 17, while the remaining part is returned to the indoor heat exchanger 7 via the lower header 7b. It will be seen that, since the ascending flow of gaseous refrigerant and the descending flow of the liquid refrigerant pass through separate pipes, the circulation of the refrigerant due to gravity is performed in an efficient manner.

In the foregoing embodiments, the heat exchange in the outdoor and indoor heat exchangers 6 and 7 is performed by making use of natural convection of air around these heat exchangers, without employing any forced drafting by a motor-driven fan. However, if electric power is available, motor-driven fans may be provided for the forced drafting to achieve a higher efficiency of heat exchange.

As has been described, according to the invention, there is provided a cooling system having a cooling apparatus including outdoor and indoor heat exchangers 6 and 7 constituting a natural circulation circuit for refrigerant, and a heat storage 5. During nighttime when the outdoor temperature is low, the cooling energy is stored in the heat storage 5, through a natural circulation of the refrigerant between the heat exchangers 6 and 7 and the heat storage 5, while the remaining part of the cooling energy is delivered to the indoor heat exchanger to effectively cool the air in the shelter, whereas during daytime when the outdoor temperature is high, the cooling energy released from the heat storage 5 is delivered to the indoor heat exchanger 7, through a natural circulation of the refrigerant between the heat storage 5 and the indoor heat exchanger 7, so as to effectively cool the air inside the shelter and, accordingly, the various telecommunication equipment in the shelter.

Consequently, no power source nor combustion source is required for the circulation of the refrigerant. Particualrly, the power and the combustion are not required at all, when the heat exchange at the heat exchangers is made solely by the natural convection of air. Even if motor-driven fans are used for the forced drafting around the heat exchangers, the power consumption by these fans are negiligibly small.

It is remarkable that the cooling system which consumes no or extremely small power can effectively cool the object in the shelter. This system of the invention is particularly effective in improving the circumstance of unattended communication stations such as microwave relay stations installed in desert or like regions where the difference is very large between the daytime and nighttime temperatures.

What is claimed is:

1. A cooling system for cooling a finite space defined by a building structure for accommodating a heat-generating body, said building structure being adapted to be located in a geographical region where a large difference is observed between maximum daytime and minimum nighttime temperatures, said cooling system comprising;
   a first heat exchanger disposed outside said space;
   a second heat exchanger disposed inside said space at a level lower than said first heat exchanger;
   a heat storage means disposed inside said space at a level intermediate between said first and second heat exchangers;
   a conduit means for constituting a closed fluid path linking and extending into said first and second heat exchangers and said heat storage means;
   a condensable refrigerant filling and flowing through said fluid path depending on the temperature difference between said space and outside thereof, said refrigerant being capable of evaporating through heat absorption at a temperature higher than a value preset for said space, and of being liquefied through heat discharge at a temperature lower than said maximum daytime temperature; and
   a heat storing agent charged in said heat storage means in contact with said fluid path, said heat storing agent being capable of being solidified through heat discharge when cooled during nighttime by said refrigerant flowing thereinto after being cooled at said first heat exchanger, and of being liquefied through heat absorption when heated during daytime by said refrigerant heated due to said heat generating body.

2. A cooling system as in claim 1, wherein said finite space constitutes a shelter for telecommunication equipment which in turn constitutes said heat generating body.

3. A cooling system as in claim 1, wherein said building structure is at least partly buried in the ground.

4. A cooling system as in claim 1, wherein said heat storage means has inner piping means in communication with said conduit means and outer piping means for holding said heat storing agent in contact with said inner piping means.

5. A cooling system as in claim 4, wherein said heat inner piping means is horizontally laid and said refrigerant is in such a quantity that it fills in liquid state up to the level as high as the midpoint in cross section of said inner piping means.

6. A cooling system as in claim 1, wherein the heat exchange at first and second heat exchangers is performed by natural convection of air.

7. A cooling system as in claim 1, wherein said conduit means has a first piping for the evaporated state of said refrigerant and a second piping for the liquefied state of said refrigerant.

8. A cooling system as in claim 1, wherein said first and second heat exchangers are slanted while said heat storage means is disposed horizontally.

9. A cooling system as in claim 1, wherein said heat storing agent is a fatty acid.

* * * * *